United States Patent
Law et al.

(10) Patent No.: US 7,029,529 B2
(45) Date of Patent: Apr. 18, 2006

(54) METHOD AND APPARATUS FOR METALLIZATION OF LARGE AREA SUBSTRATES

(75) Inventors: Kam S. Law, Union City, CA (US); Robert Z. Bachrach, Burlingame, CA (US); John M. White, Hayward, CA (US); Quanyuan Shang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 23 days.

(21) Appl. No.: 10/247,403

(22) Filed: Sep. 19, 2002

(65) Prior Publication Data

US 2004/0058067 A1    Mar. 25, 2004

(51) Int. Cl.
*B05C 1/02* (2006.01)
*B05C 13/02* (2006.01)

(52) U.S. Cl. .................. 118/211; 118/212; 118/264; 118/46; 101/368; 101/379; 101/474

(58) Field of Classification Search ............. 118/211, 118/212, 264, 46, 319, 320, 323; 101/368, 101/378, 379, 474; 216/41, 44, 48
See application file for complete search history.

(56) References Cited

U.S. PATENT DOCUMENTS

| | | | |
|---|---|---|---|
| 2,905,539 A * | 9/1959 | Bowerman | 174/250 |
| 4,619,741 A | 10/1986 | Minten et al. | 204/15 |
| 4,631,117 A | 12/1986 | Minten et al. | 204/15 |
| 4,964,959 A | 10/1990 | Nelsen et al. | 204/15 |
| 5,003,356 A | 3/1991 | Wakai et al. | 357/4 |
| 5,015,339 A | 5/1991 | Pendleton | 204/15 |
| 5,032,883 A | 7/1991 | Wakai et al. | 357/23.7 |
| 5,055,899 A | 10/1991 | Wakai et al. | 357/23.7 |
| 5,079,600 A | 1/1992 | Schnur et al. | 357/4 |
| 5,110,355 A | 5/1992 | Pendleton | 106/1.11 |
| 5,139,642 A | 8/1992 | Randolph et al. | 205/125 |
| 5,144,747 A | 9/1992 | Eichelberger | 29/839 |
| 5,166,085 A | 11/1992 | Wakai et al. | 437/40 |
| 5,206,052 A | 4/1993 | Nakaso et al. | 427/97 |
| 5,229,644 A | 7/1993 | Wakai et al. | 257/749 |
| 5,250,843 A | 10/1993 | Eichelberger | 257/692 |
| 5,256,441 A | 10/1993 | Huenger et al. | 427/8 |
| 5,258,200 A | 11/1993 | Mayernik | 427/8 |
| 5,327,001 A | 7/1994 | Wakai et al. | 257/350 |

(Continued)

OTHER PUBLICATIONS

Michel, Et al., "Printing meets lithography: Soft approaches to high-resolution patterning," IBM J Res & Dev, 45(5), Sep. 2001, 697-719.

(Continued)

*Primary Examiner*—Laura Edwards
(74) *Attorney, Agent, or Firm*—Patterson & Sheridan, LLP

(57) ABSTRACT

A system and method for processing large area substrates. In one embodiment, a system for processing large area substrates includes prep station, a stamping station and a stamp that is automatically moved between the stamping station and the prep station. The stamping station is adapted to retain a large area substrate thereon. The stamp has a patterned bottom surface that is adapted for microcontact printing. The prep station is for applying a precursor to the patterned bottom surface of the stamp. In one embodiment, a method for processing large area substrates includes the steps of disposing a large area substrate on a platen, inking a stamp adapted for microcontact printing, and automatically contacting a bottom of the stamp to the large area substrate supported on a platen.

47 Claims, 10 Drawing Sheets

U.S. PATENT DOCUMENTS

| | | | |
|---|---|---|---|
| 5,429,861 A | 7/1995 | Mayernik | 428/209 |
| 5,433,821 A * | 7/1995 | Miller et al. | 216/18 |
| 5,438,751 A | 8/1995 | Miyazaki et al. | 29/847 |
| 5,448,021 A | 9/1995 | Arai | 174/257 |
| 5,472,889 A | 12/1995 | Kim et al. | 437/40 |
| 5,476,580 A | 12/1995 | Thorn et al. | 205/122 |
| 5,480,048 A | 1/1996 | Kitamura et al. | 216/13 |
| 5,512,131 A | 4/1996 | Kumar et al. | 156/655.1 |
| 5,538,616 A | 7/1996 | Arai | 205/126 |
| 5,615,030 A | 3/1997 | Harada et al. | 349/110 |
| 5,626,994 A | 5/1997 | Takayanagi et al. | 430/7 |
| 5,631,753 A | 5/1997 | Hamaguchi et al. | 349/110 |
| 5,688,408 A | 11/1997 | Tsuru et al. | 216/17 |
| 5,690,805 A | 11/1997 | Thorn et al. | 205/118 |
| 5,776,748 A | 7/1998 | Singhvi et al. | 435/180 |
| 5,826,330 A | 10/1998 | Isoda et al. | 29/852 |
| 5,830,563 A | 11/1998 | Shimoto et al. | 428/209 |
| 5,835,179 A | 11/1998 | Yamanaka | 349/161 |
| 5,851,918 A | 12/1998 | Song et al. | 438/627 |
| 5,900,160 A | 5/1999 | Whitesides et al. | 216/41 |
| 5,929,958 A | 7/1999 | Ohta et al. | 349/141 |
| 5,947,027 A * | 9/1999 | Burgin et al. | 101/474 |
| 5,952,718 A | 9/1999 | Ohtsuka et al. | 257/737 |
| 5,957,648 A | 9/1999 | Bachrach | 414/217 |
| 5,976,826 A | 11/1999 | Singhvi et al. | 435/29 |
| 5,995,187 A | 11/1999 | Shimizu et al. | 349/147 |
| 6,060,121 A | 5/2000 | Hidber et al. | 427/261 |
| 6,104,464 A | 8/2000 | Adachi et al. | 349/150 |
| 6,107,120 A | 8/2000 | Ohtsuka et al. | 438/106 |
| 6,123,815 A | 9/2000 | Omasa | 204/222 |
| 6,136,702 A | 10/2000 | Chandross et al. | 438/678 |
| 6,143,412 A | 11/2000 | Schueller et al. | 428/408 |
| 6,162,365 A | 12/2000 | Bhatt et al. | 216/13 |
| 6,180,239 B1 | 1/2001 | Whitesides et al. | 428/411.1 |
| 6,212,769 B1 | 4/2001 | Boyko et al. | 29/852 |
| 6,261,435 B1 | 7/2001 | Omasa | 205/205 |
| 6,262,696 B1 | 7/2001 | Seraphim et al. | 345/1 |
| 6,265,671 B1 | 7/2001 | Matsuno | 174/255 |
| 6,285,042 B1 | 9/2001 | Ohtani et al. | 257/66 |
| 6,316,738 B1 | 11/2001 | Mori et al. | 174/261 |
| 6,319,741 B1 | 11/2001 | Izumi et al. | 438/30 |
| 6,329,226 B1 | 12/2001 | Jones et al. | 438/151 |
| 6,339,197 B1 | 1/2002 | Fushie et al. | 174/262 |
| 6,342,682 B1 | 1/2002 | Mori et al. | 174/262 |
| 6,348,367 B1 | 2/2002 | Ohtani et al. | 438/151 |
| 6,355,198 B1 | 3/2002 | Kim et al. | 264/259 |
| 6,358,630 B1 | 3/2002 | Tsukada et al. | 428/646 |
| 6,359,035 B1 | 3/2002 | Ono et al. | 523/339 |
| 6,365,843 B1 | 4/2002 | Shirai et al. | 174/262 |
| 6,368,838 B1 | 4/2002 | Singhvi et al. | 435/177 |
| 6,383,345 B1 | 5/2002 | Kim et al. | 204/192.11 |
| 6,736,985 B1 * | 5/2004 | Bao et al. | 216/13 |
| 2001/0045362 A1 | 11/2001 | Deng et al. | 205/120 |
| 2002/0050220 A1 | 5/2002 | Schueller et al. | 101/486 |
| 2002/0066978 A1 | 6/2002 | Kim et al. | 264/259 |

OTHER PUBLICATIONS

Xia, t al., "Soft Lithography," Annu. Rev. Mater. Sci, 28, 1998, 153-184.

"Soft Lithography," http://www.ee.washington.edu/research/microtech/cam/CAMsoftlithhome.html.

* cited by examiner

METHOD AND APPARATUS FOR METALLIZATION OF LARGE AREA SUBSTRATES

BACKGROUND OF THE INVENTION

1. Field of the Invention

Embodiments of the invention generally relate to metallization of large area substrates.

2. Background of the Related Art

Integrated circuits typically include a plurality of devices formed from dielectric, conductive and semiconductive material. Conductive materials, such as metals, are typically deposited on a substrate by chemical vapor deposition, physical vapor deposition, electroplating and electroless plating.

Electroless plating has generated interest due to its ability to produce highly conformal selective deposition without the requirement of a vacuum chamber. This is particularly attractive for the metallization of large area substrates (i.e., substrates in excess of about 1 meter square) where the chamber costs and associated vacuum pump hardware may become prohibitively expensive, particularly if market demands for substrates exceeding 1.5 square meters are to become realized.

One method for patterning metal on substrates using electroless deposition is microcontact printing. Microcontact printing typically entails applying a precursor or catalyst to the substrate surface using a patterned elastomeric stamp. The catalyst is typically a self-aligning monomer that remains highly ordered on the substrate surface. An electrolyte solution is then applied to the substrate and deposits a layer of metal on the catalyst sites, thereby creating a patterned metal line. Although the use of microcontact printing and electroless deposition has been demonstrated as being capable to produce conductive lines on substrates having diameters of 8 inches or less, its applicability to large area substrates remains unproven. For example, the ability to transfer the catalyst from the stamp over a large surface area on a flexible large area substrate has not been demonstrated. Moreover, a method for the application of the catalyst to a large area substrate in a production environment has not been developed. Additionally, a method to overcome the capillary forces between the stamp and the substrate must be developed in order to separate the substrate from the stamp.

Therefore, there is a need for a method and apparatus for electroless plating of large area substrates.

SUMMARY OF THE INVENTION

One aspect of the present invention generally provides a system for processing large area substrates. In one embodiment, a system for processing large area substrates includes prep station, a stamping station and a stamp that is automatically moved between the stamping station and the prep station. The stamping station, is adapted to retain a large area substrate thereon. The stamp has a patterned bottom surface that is adapted for microcontact printing. The prep station is for applying a precursor to the patterned bottom surface of the stamp.

In another aspect of the invention, a method for processing large area substrates is provided. In one embodiment, a method for processing large area substrates includes the steps of inking a stamp adapted for microcontact printing, microcontact printing a precursor on a large area substrate, and automatically contacting a bottom of the stamp with an exposed surface of the large area substrate supported on a platen.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

Figure 1:
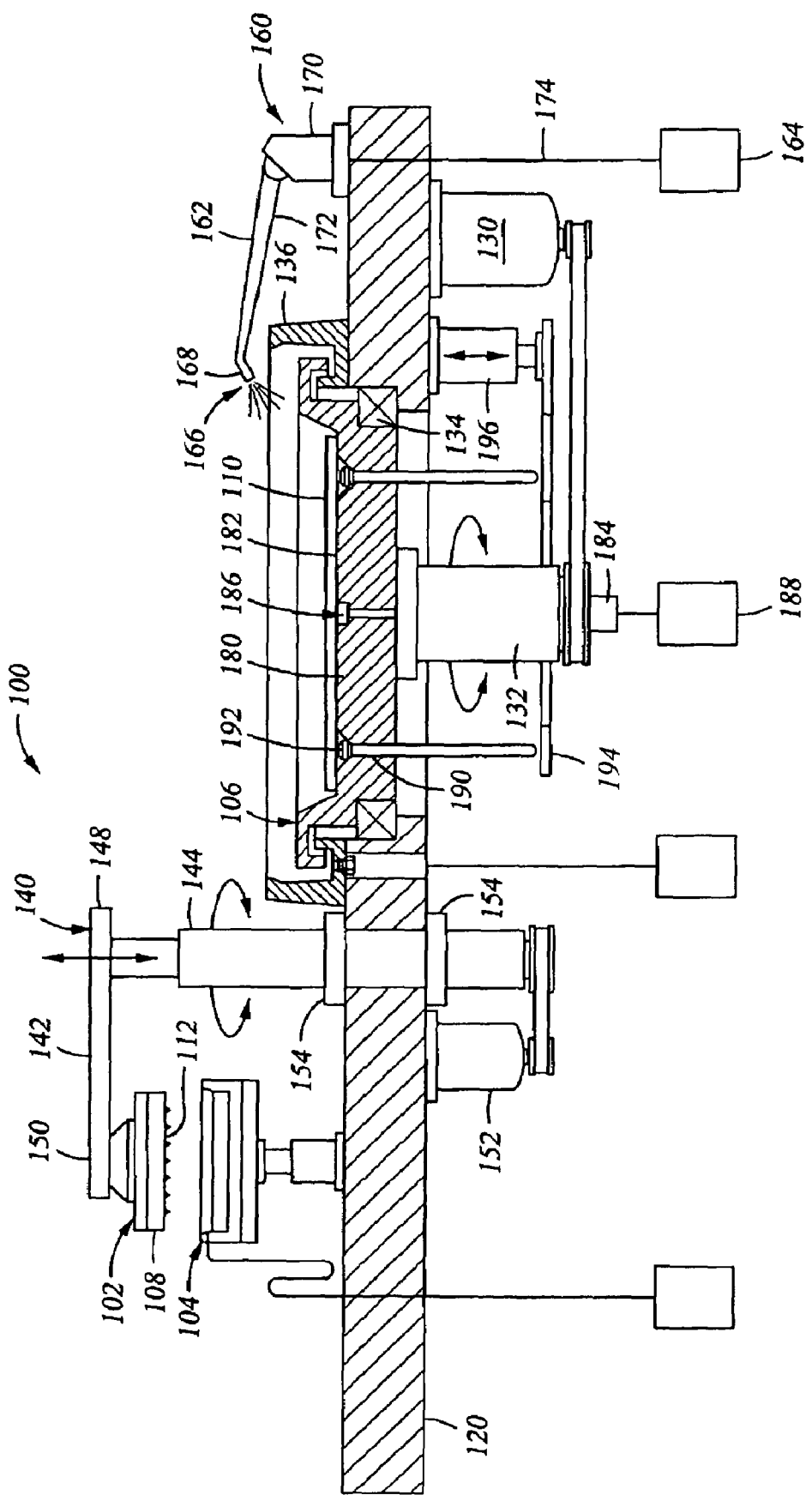
FIG. 1 is a front elevation, partially in cross-section, of one embodiment of a processing system adapted for direct deposition of patterned metal on large area substrates.

FIG. 1 is a front elevation of one embodiment of a processing system 100 adapted for direct deposition of patterned metal on large area substrates. The processing system 100 generally includes a stamping head assembly 102 adapted to move between a head prep station 104 and at least one stamping station 106. The stamping head assembly 102 includes a patterned stamp 108 having a patterned bottom surface 112 that is adapted for microcontact printing. The patterned bottom surface 112 of the stamp 108 is conditioned and inked at the head prep station 104. The inked stamping head assembly 102 is moved over a substrate 110 retained in the stamping station 108. The patterned bottom surface 112 of the stamp 108 is placed in contact with the substrate 110 retained in the stamping station 106 to transfer a precursor to the substrate 110. In one embodiment, the precursor is generally a self-assembling monolayer (SAM). Some SAMs function as autocatalytic sites for electroless plating of materials such as copper, gold, silver, nickel, cobalt and other materials platable by electroless processes. Other SAMs function as a mask (i.e., a resist) for selectively preventing plating of the substrate. In one embodiment, a substrate, having the SAM printed thereon, is exposed to an electrolyte solution that deposits metal through an electroless plating process on the SAM, resulting in a patterned metal conductive pattern on the substrate 110.

In the embodiment depicted in FIG. 1, the stamping head assembly 102 is coupled to a head robot 140. The head robot 140 is adapted to selectively position the stamping head assembly 102 over the head prep station 104 and the stamping station 106. The head robot 140 is typically disposed between the head prep station 104 and the stamping station 106 and coupled to a base 120 of the system 100.

In one embodiment, the head robot 140 includes an arm 142 coupled to a linear actuator 144. The arm 142 supports the head assembly 102 in a cantilevered orientation. The arm 142 is typically manufactured from a stiff, low inertia material such as aluminum. The arm 142 has a first end 148 that is coupled to the linear actuator 144 and an opposing second end 150. The stamping head assembly 102 may be directly coupled to the second end 150 of the arm 142 as depicted in FIG. 1 or have a stamp swapping mechanism (shown in the embodiment depicted in FIG. 9) coupled therebetween.

The linear actuator 144 typically controls the elevation of the arm 142 so that the arm 142 may be brought into contact with and moved clear of the head prep station 104 and the stamping station 106. The linear actuator 144 may be a pneumatic cylinder, a hydraulic cylinder, a lead screw, or other device suitable for controlling the elevation of the stamping head assembly 102 relative to the base 120. The linear actuator 144 is coupled to the base 120 of the system 100 so that the arm 142 may be rotated between the head prep station 104 and the stamping station 106.

A rotational actuator 152 is typically coupled between the base 120 and the linear actuator 144 to control the rotation of the arm 142. The rotational actuator 152 may be a stepper, servo or other electric motor, a solenoid, a rotary cylinder, an offset pneumatic cylinder or other devise suitable for effectuating controlled rotation of the stamping head assembly 102. Additionally, one or more bearings 154 may be disposed between the base 120 and the linear actuator 144 to facilitate smooth and reliable movement of the linear actuator 144 and arm 142 holding the stamp 108.

Figure 2:
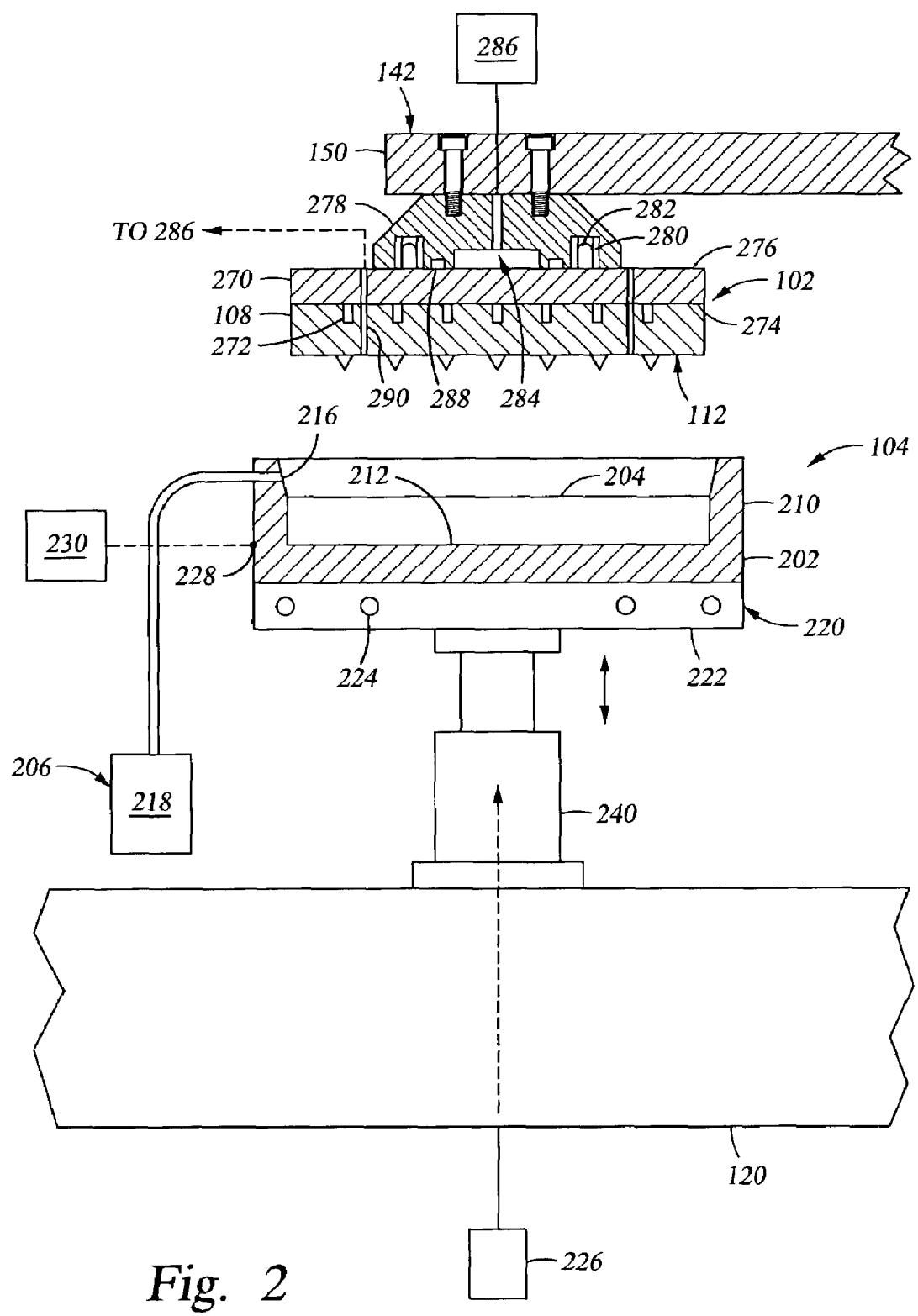
FIG. 2 is a front elevation, partially in cross-section, of one embodiment of a stamping head assembly supported over one embodiment of the head prep station.

FIG. 2 depicts the stamping head assembly 102 supported over one embodiment of the head prep station 104. The stamping head assembly 102 generally includes a backing plate 270 that is coupled to the stamp 108. The backing plate 270 is typically fabricated from a stiff yet flexible material, such as a thin sheet of metal. Examples of suitable metals for the backing plate 270 include stainless steel and aluminum. The stamp 108 is typically fabricated from an elastomeric material having a stiffness less than that of the backing plate 270, such as silicone rubber.

The backing plate 270 may be coupled to the stamp 108 in either a permanent or removable manner, for example by use of adhesives, insert molding, screws, clamps, barbs and the like. In one embodiment, the backing plate 270 includes a plurality of micro-machined barbs 272 extending from a first side 274 of the backing plate 270 that are inserted into the stamp 108.

A second side 276 of the backing plate 270 is removably coupled to the second end 150 of the arm 142. This arrangement allows the stamping head assembly 102 to be replaced after a predetermined number of uses or to change to a second stamp (not shown) having another pattern disposed thereon.

A mounting block 278 is typically coupled between the backing plate 270 and the arm 142 to provide a quick release device that accurately and repeatably couples the stamping head assembly 102 to the arm 142. The mounting block 278 includes a plurality of bushings 280 disposed therein, each mating with a locating pin 282 that extends from the backing plate 270. A vacuum port 284 is formed in the mounting block 278 and coupled to a vacuum source 286. An o-ring 288 or other suitable seal is disposed between the mounting block 278 and backing plate 270 to facilitate vacuum chucking of the stamping head assembly 102 to the mounting block 278. Alternatively, the stamping head assembly 102 may be coupled to the mounting block 278 by other quick release devices such as fasteners, collets, snap fit, removable adhesives, clamps, latches, electrostatic chucks, magnetic chucks and the like.

In one embodiment, a plurality of vents 290 are formed through the backing plate 270 and stamp 108. The vents 290 provide a passage for air disposed between the stamp 108 and substrate 110 to escape as the substrate 110 and stamp 108 are brought in contact with one another, thereby ensuring uniform and complete contact between the bottom patterned surface 112 of the stamp 108 and the substrate 110. Optionally, the vents 290 may be coupled to the vacuum source 286 to assist in the removal of trapped air. The vacuum source 286 may also provide pressurized fluid through the vents 290 to assist in separating the stamp 108 from the substrate 110 after stamping.

The head prep station 104 includes a basin 202, a pad 204 and a precursor replenishment system 206. The basin 202 is fabricated from a material compatible with precursor chemistries, such as polypropylene, polyethylene, fluoropolymers and stainless steel, among others. The basin 202 includes a bottom 212 and a circumscribing lip 210 and is generally adapted to retain a predetermined quantity of precursor. The bottom 212 of the basin 202 is coupled to the base 120 of the system 100. The stamp 108 is typically lowered into the basin 202 to wet the patterned bottom surface 112 of the stamp 108 with the precursor disposed within the basin 202.

Alternatively, a basin actuator 240 may be coupled between the basin 202 and the base 120 of the system 100 to elevate the basin 202 to contact the stamp 108 of the stamping head assembly 102. The basin actuator 240 may be a pneumatic cylinder, a hydraulic cylinder, a stepper motor and lead screw or other linear actuator.

The pad 204 is retained in the basin 202 to hold the precursor. The pad 204 is typically fabricated from a porous or meshed material such as polypropylene, felt, metal or metal mesh, or the like, that is compatible with precursor chemistries.

A predetermined quantity of precursor is retained on the pad 204 by periodically adding additional precursor to the basin 202 using the precursor replenishment system 206. The precursor replenishment system 206 includes an outlet 216 coupled to a precursor source 218. The outlet 216 is coupled to or disposed proximate the basin 202 and adapted to flow precursor from the source 218 to the pad 204. The precursor source 218 includes a various flow control mechanisms (not shown) such as pumps, regulators and control valves.

In one embodiment, the precursor source 218 provides a predetermined amount of precursor to the basin 202 before each stamp inking event. It is contemplated that different precursors may be utilized to provide autocatalytic sites for electroless plating of materials such as copper, gold, silver, nickel, cobalt and other materials platable by electroless processes or serve as a mask for selective plating.

A thermal control device 220 is utilized to control the temperature of the precursor disposed in the basin 202. In one embodiment, the thermal control device 220 is a heat transfer plate 222 coupled to the basin 202. The heat transfer plate 222 includes a conduit 224 for circulating a heat transfer fluid supplied from a heat transfer fluid source 226. The heat transfer fluid source 226 regulates the temperature of the heat transfer fluid flowing through the plate 222 to control the temperature of the precursor retained in the basin 202. Alternatively, the thermal control device 220 may have a resistive heater, a radiant heater or a thermal electric device embedded in or disposed proximate to the basin 202 or heat transfer plate 222.

A sensor 228 is typically coupled to the basin 202 or heat transfer plate 222 and coupled to a controller 230. The sensor 228 provides the controller 230 with a metric indicative of the temperature of the precursor. The controller 230 is typically coupled to the thermal control device 220 and provides closed loop temperature control of the precursor.

Figure 9:
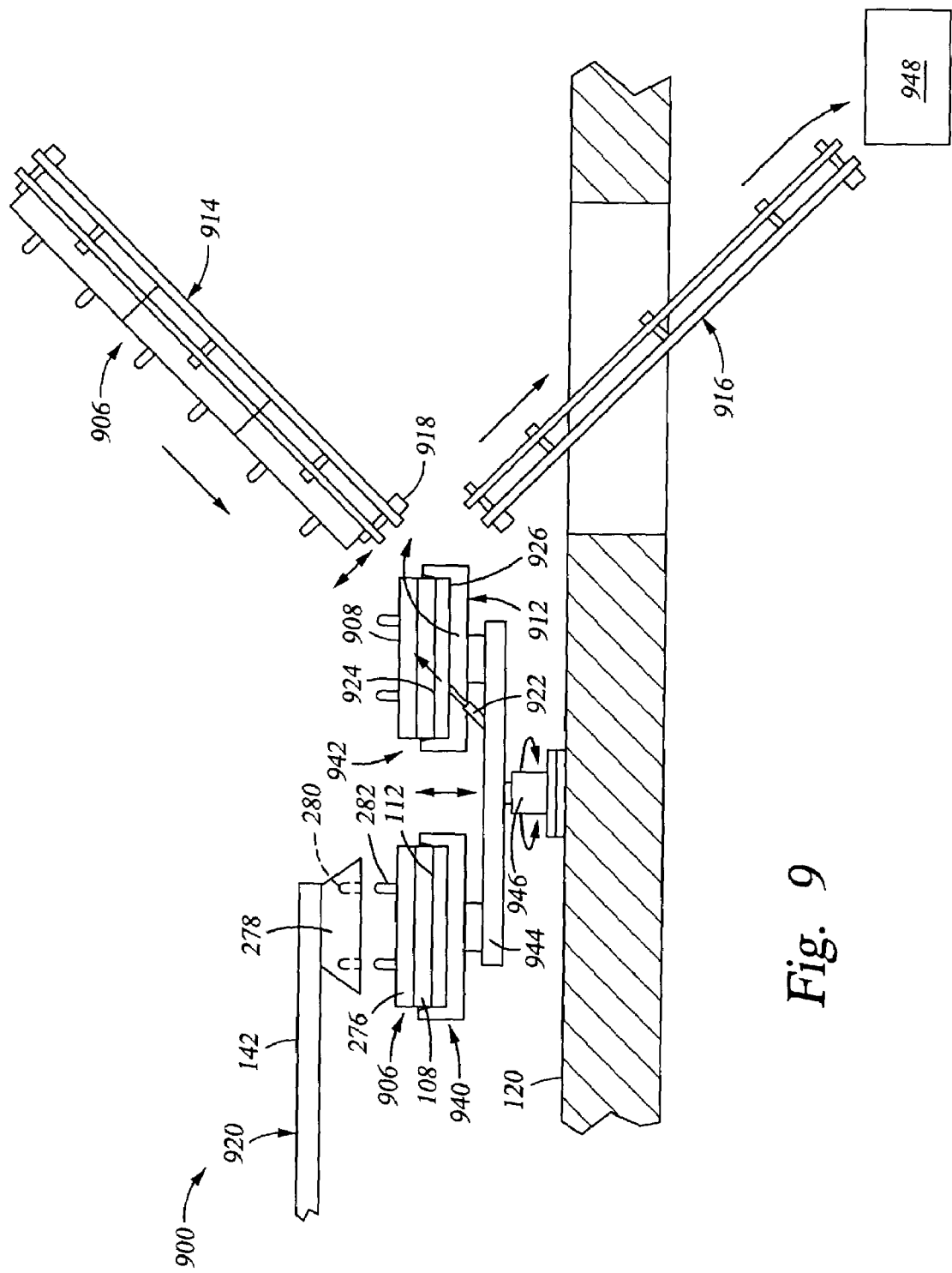
FIG. 9 is a partial sectional view of another embodiment of a head prep station.

Returning to FIG. 1, the stamping station 106 is typically coupled to the base 120 proximate the head robot 140. The stamping station 106 generally supports the substrate 110 thereon during a microcontact printing process. At least one of the stamping station 106 or the stamping head assembly 102 is moved to position the stamp 108 in a predetermined position over the substrate 110. Then, at least one of the stamping station 106 or the stamping head assembly 102 is moved to contact the stamp 108 with the substrate 110 to transfer the precursor, carried by the stamp 108, to the substrate. The stamping station 106 may additionally be configured to perform an electroless or electroplating process, or the substrate may be transferred from the stamping station 106 to a separate plating station as depicted in FIG. 9.

In one embodiment, the stamping station 106 includes a platen 180 coupled to the base 120 of the system 100 and having a substrate support surface 182. The platen 180 is typically fabricated from a rigid material such as granite, stainless steel, quartz, ceramic or similar material. The support surface 182 is lapped, ground or otherwise finished to a flatness that ensures reliable and precise transfer of the precursor from the patterned surface 112 of the stamp 108 to the substrate 110.

The platen 180 includes a chucking system 186 that securely retains the substrate 110 on the support surface 182 of the platen 180. The chucking system 186 may be an electrostatic chuck, a vacuum chuck or a substrate clamp. In the embodiment depicted in FIG. 1, the chucking system 186 includes a fluid controller 188 adapted to establish a vacuum between the substrate 110 and the support surface 182 of the platen 180.

Figure 3A:
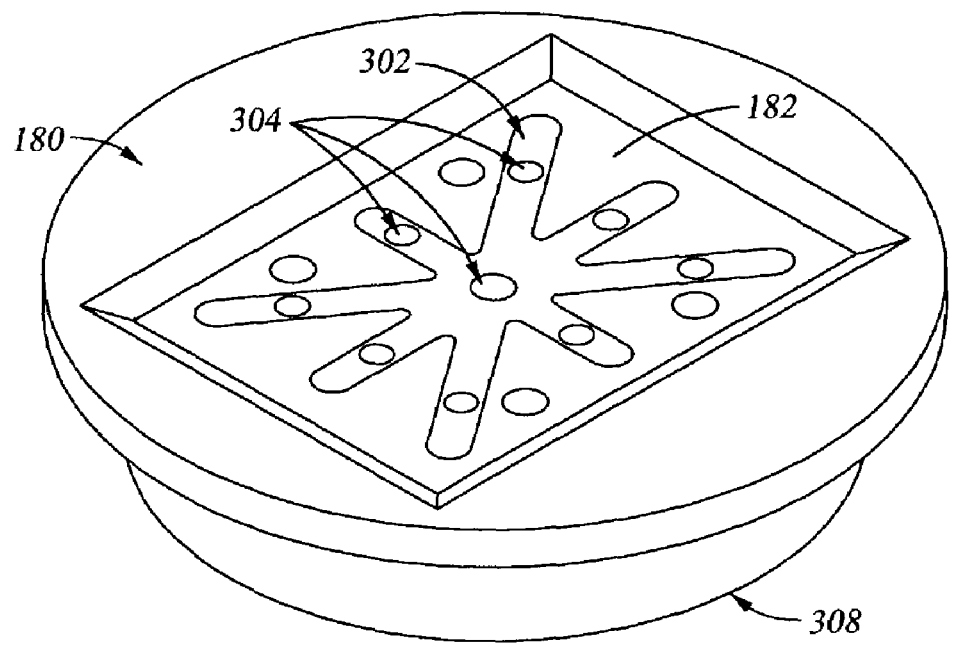
FIGS. 3A and 3B depict a top isometric and a partial sectional view of one embodiment of a platen.
Figure 3B:
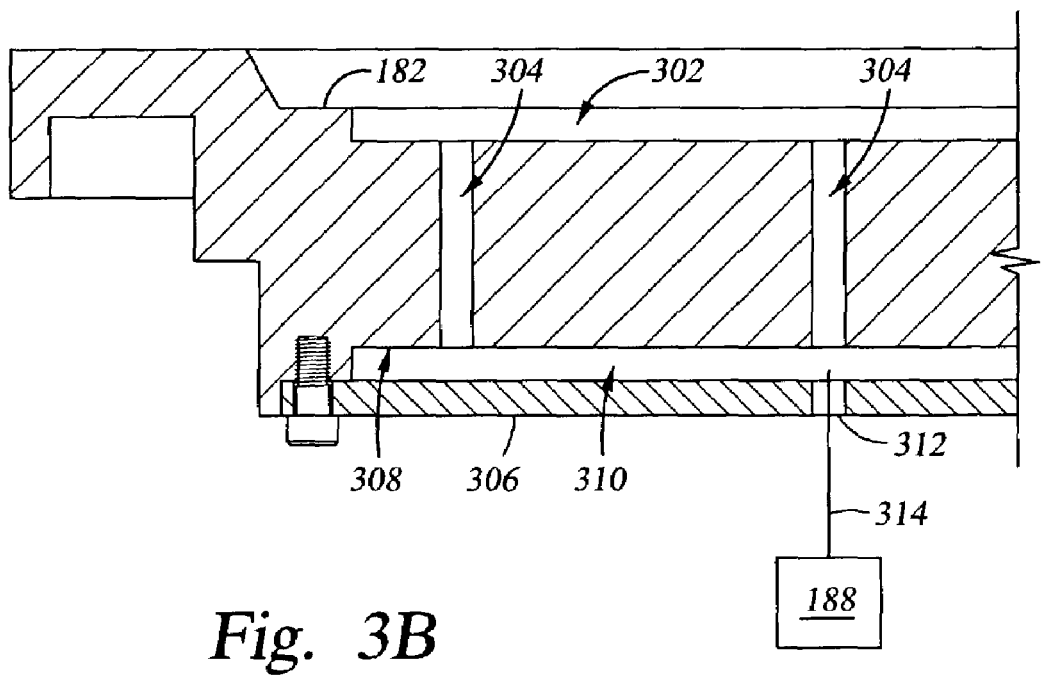

FIGS. 3A and 3B depict top isometric and sectional views of one embodiment of the platen 180. The support surface 182 of the platen 180 includes at least one channel or hole formed in the support surface 182 and in communication with the fluid controller 188 to distribute the vacuum force applied to the substrate 110. In one embodiment, a plurality of channels 302 are formed in the support surface 182 of the platen 180. The channels 302 are typically orientated in a radial pattern. Alternatively, the channels 302 may be configured in a orthogonal hatched pattern, a striped pattern, concentric, a combination radial and concentric channels, or other pattern configured to distribute vacuum between the substrate 110 and the platen 180. The channel width and density is typically selected to sufficiently distribute the vacuum while leaving enough contact area between the support surface 182 and the substrate 110 to prevent localized dishing or bowing of the substrate 110 (ie., the substrate remains flat upon application of the vacuum). Additionally, the channel configuration should be selected to minimize the probability of air entrapment between the substrate 110 and support surface 182 of the platen 180.

At least one hole 304 is formed through the platen 302 coupling the channels 302 to the fluid controller 188. Optionally, a plurality of holes 304 may be utilized without the channels 302. Typically, a plurality of holes 304 are positioned about the support surface 182 to ensure substantially equal application of vacuum force and fast response time. In one embodiment, a back plate 306 is coupled to a second side 308 of the platen 180 opposite the support surface 182 and forms a plenum 310 with the platen 180 that is in fluid communication with the holes 304. The plenum 310 advantageously allows the vacuum to be drawn evenly through each of the holes 304 thereby providing a substantially uniform vacuum force across the width of the support surface 182. The back plate 306 has a gas port 312 formed therethrough that is coupled to the fluid controller 188 through a supply line 314. In embodiments where the platen 180 rotates, the supply line 314 is coupled through a rotary union 184 (depicted in FIG. 1) to facilitate fluid delivery while the platen 180 rotates. The fluid controller 188 may optionally be configured to flow a fluid, such as an inert gas, nitrogen, air or de-ionized water, through the hole 304 and channels 302 formed in the support surface 182 to urge the substrate 110 away from the platen 180 after processing to facilitate substrate removal from the stamping station 106.

Returning to FIG. 1, the stamping station 106 additionally includes a plurality of lift pins 190 disposed through the platen 180. The lift pins 190 typically include flared ends 192 that seats flush with or slightly below the support surface 182 of the platen 180. A lift ring 194 is typically disposed below the platen 180 and is coupled to the base 120 by a pin lift actuator 196. The pin lift actuator 196 may be actuated to move the lift ring 194 towards the platen 180, thereby contacting a portion of the lift pins 190 extending below the platen 180 and causing the flared ends 192 to extend above the support surface 182, placing the substrate 110 in a space-apart relation to the platen 180, thereby facilitating transfer of the substrate 110 between the stamping station 106 and a transfer robot (not shown).

In the embodiment depicted in FIG. 1, the stamping station 102 is also configured to function as an electroless deposition station. To facilitate electroless deposition on the substrate 110 after inking, an electrolyte delivery system 160 is disposed proximate the platen 180 and is adapted to flow an electrolyte solution onto the substrate 110 disposed on the platen 180.

The electrolyte delivery system 160 includes a fluid delivery arm 162 and an electrolyte source 164. The arm 162 has a fluid outlet 166 at a first end 168 and is coupled to a stanchion 170 at a second end 172. The stanchion 170 is coupled to the base 120. An electrolyte supply line 174 is coupled between the electrolyte source 164 and the fluid outlet 166 to facilitate flow of electrolyte to the substrate 110.

The electrolyte provided by the electrolyte source 164 is typically chosen according to the electrochemical process being performed. In one embodiment, an electroless plating process is performed utilizing a suitable electrolyte, for example, solutions containing at least one metal such as TiN, palladium or copper. In alternative embodiments, the electrolyte may include $H_2SO_4$ and $CuSO_4$ in aqueous solution or other alternative compositions for different conductors.

The platen 180 is typically rotated or oscillated during the electroless deposition process to agitate the electrolyte disposed on the platen 180. A rotary actuator 130 is coupled to a shaft 132 extended below the platen 180. Bearings 134 are disposed between the platen 180 and the base 120 to facilitate smooth rotation of the platen 180. After completion of the deposition process and/or to assist in rinsing the substrate 110, the platen 180 may be spun at a velocity that drives the fluids from the substrate 110. A splash guard 136 is disposed on the base 180 and is interleaved with the platen 180 to catch the fluids leaving the substrate 110 and the platen 180 to avoid contamination of adjacent areas of the system 100.

Figure 4:
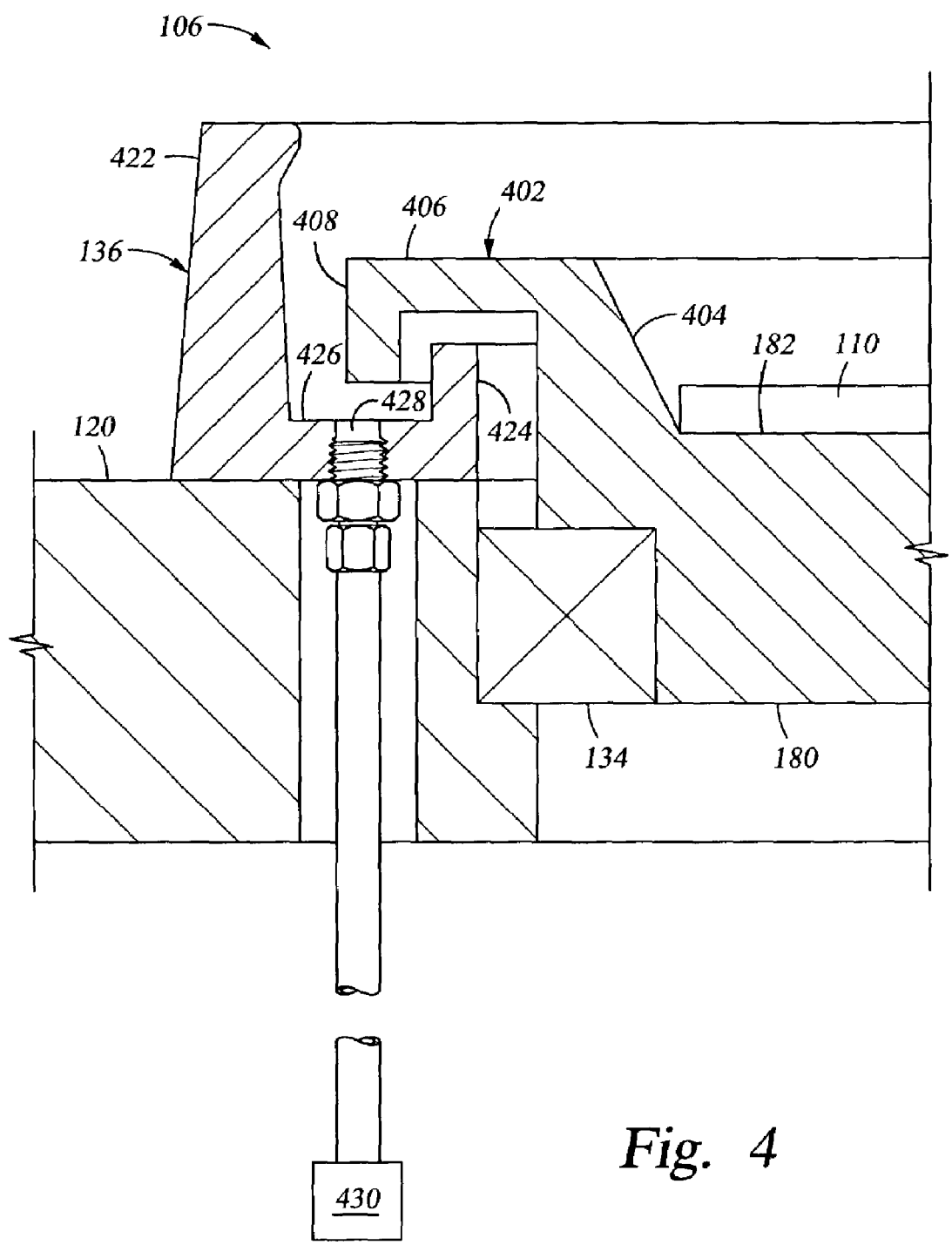
FIG. 4 is another partial sectional view of the platen of FIG. 3A.

FIG. 4 depicts a partial sectional view of and embodiment of the splash guard 136 and the platen 180. The splash guard 136 includes an annular outer wall 422 and an annular inner wall 424 coupled by a bottom member 426. The outer wall 422 projects from the bottom member 426 to an elevation above the platen 180 to prevent fluids from leaving the stamping station 106.

The platen 180 includes a lip 402 configured to position the substrate 110 on the support surface 182. The lip 402 includes an inner wall 404 that is disposed at an obtuse angle relative to the center region of the support surface 182. The angle of the wall 404 assists in positioning the substrate 110 in a predetermined position on the platen 180 and prevents the substrate 110 from moving laterally on the platen 180 while rotating.

The lip 402 includes a flange 406 extending radially outward to a downwardly facing rim 408. The rim 408 interleaves with the inner wall 424 of the splash guard 136 to prevent fluids captured by the splash guard 136 from reaching the bearings 134 or other system components. A port 428 is formed through the bottom member 426 and is coupled to an electrolyte reclamation system 430 for recycling or disposal of the electrolyte utilized for plating the substrate 110.

Figure 5:
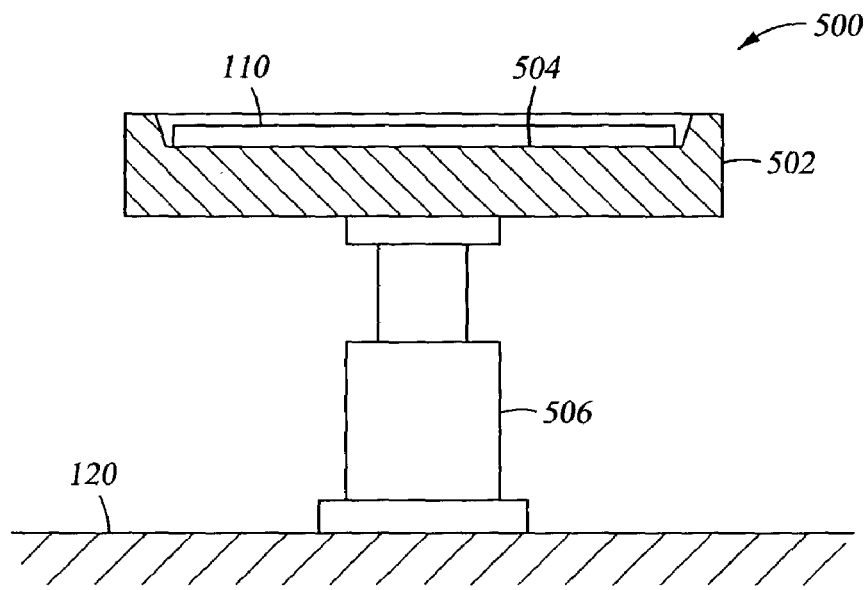
FIG. 5 is a partial sectional view of another embodiment of a platen.

FIG. 5 is a sectional view of another embodiment of a stamping station 500 coupled to the base 120 of the processing system. The stamping station 500 is typically not configured for plating. Electroplating is typically performed at an adjacent plating cell such as illustrated in the processing system depicted in FIG. 11. The stamping station 500 includes a platen 502 having a support surface 504 adapted to support the large area substrate 110. The platen 502 includes lift pins and a chucking system similar the platen 180 described above (omitted from FIG. 5 for clarity).

The platen 502 may be fixed relative to the base 120 and rely on the movement of the stamp 108 for contacting the substrate 110 seated on the support surface 504. Alternatively, the platen 502 may be coupled to the base 120 by a platen actuator 506 that controls the elevation of the platen 502 relative the base 120. For example, the platen actuator 506 may be activated to raise the platen 502 towards the stamp 108 positioned thereover to contact the substrate 110 to the bottom surface 112 of the stamp 108 to facilitate inking (i.e., precursor transfer from the stamp to the substrate).

Figure 6:
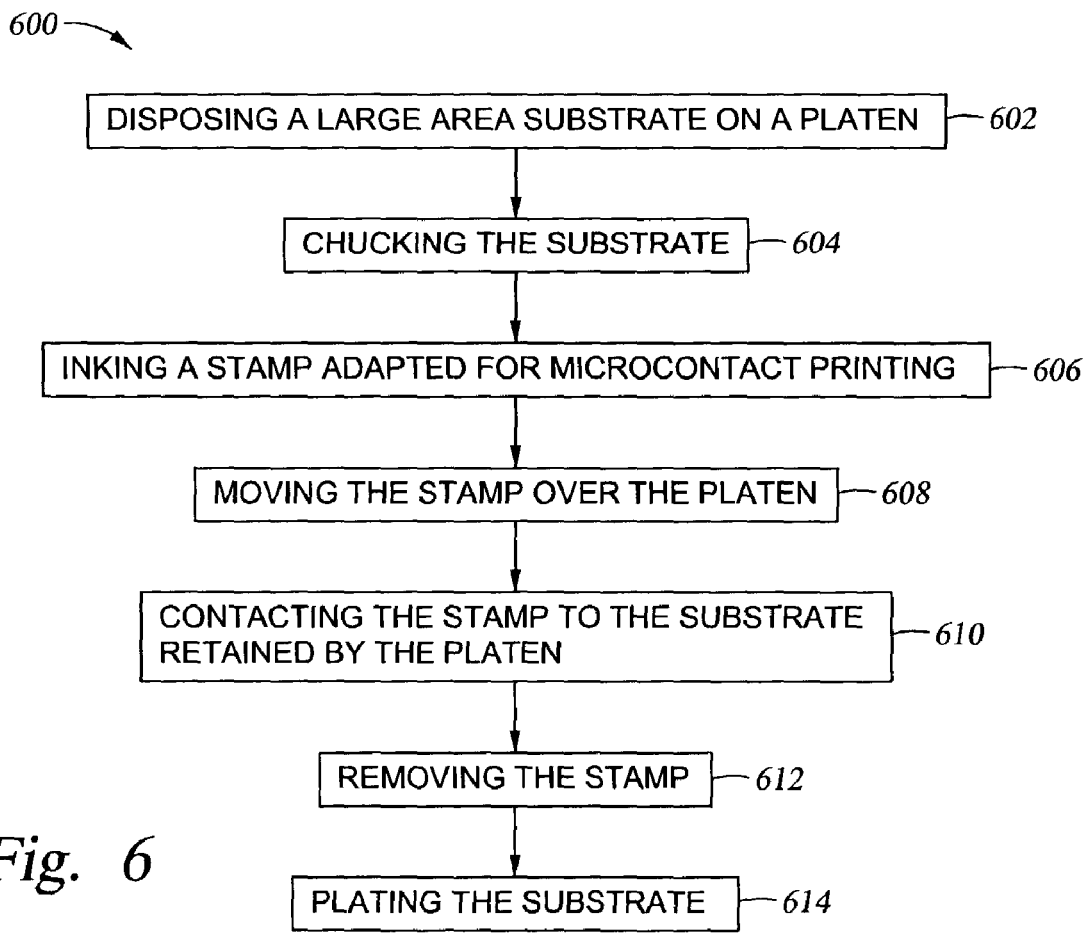
FIG. 6 is a flow diagram of one mode of operation of the system of FIG. 1.

FIG. 6 is a flow diagram of one mode of operation of the processing system of FIG. 1 performing a method 600 adapted for direct deposition of patterned metal on large area substrates.

The method 600 starts at step 602 by disposing a large area substrate on the platen 180. At step 604, the substrate 110 is chucked to the platen 180. The chucking step 604 may include removing air trapped between the substrate and the support surface 182 of the platen 180.

At step 606, the stamp 108 is inked with a precursor. The stamp is then moved over the platen 180 by the head robot 140 at step 608. Alternatively, the platen 180 may be moved below the stamp.

At step 610, the stamp is contacted with the substrate retained in the platen 180. The step of contacting the stamp may be facilitated by moving the stamp 108 toward the platen 180, or alternatively, moving the platen 180 toward the stamp 108 or combinations thereof.

At step 612, the stamp is removed from the stamping station 106. At step 614, the substrate 110 is plated by chemical reaction between the precursor and an electrolyte flowed over the substrate. The plating step may include rotating the substrate. Alternatively, the substrate may be transferred from the stamping station to a dedicated plating station for plating.

Figure 7:
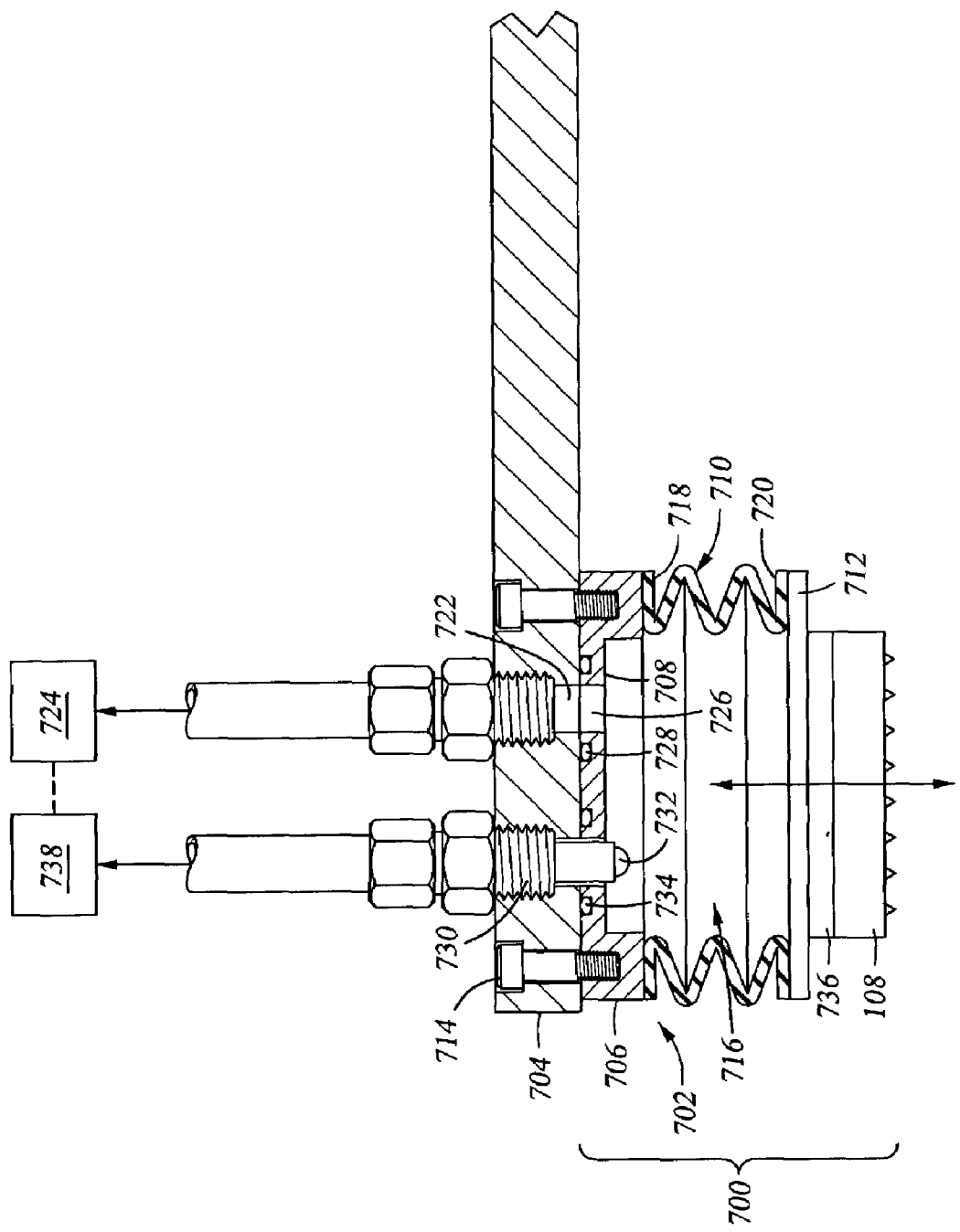
FIG. 7 is a partial sectional view of another embodiment of a stamping head assembly.

FIG. 7 depicts another embodiment of a stamping head assembly 700. The stamping head assembly 700 generally includes a support assembly 702 that couples the stamp 108 to an arm 704 of a head robot (not shown). The support assembly 702 includes a mounting ring 706, a seal plate 708, a bellows 710 and a mounting plate 712. The mounting ring 706 is typically coupled to the arm 704 by a plurality of fasteners 714. The mounting ring 706 is fabricated from a rigid material such as aluminum or stainless steel, among others.

The seal plate 708 is coupled to the mounting ring 706. Alternatively, the seal plate 708 may be fabricated as a unitary portion of the mounting ring 706. The seal plate 708 and mounting ring 706 are sealingly coupled, for example, by adhesives, brazing, welding or by fastening the plate 708 and ring 706 with a seal or o-ring therebetween.

The bellows 710 provides a flexible seal between the seal plate 708 and the mounting plate 712, defining an expandable plenum 716 therebetween. The bellows 710 is typically metallic to provide both rigidity and flexibility while minimizing particle generation during expansion and contraction. A first end 718 of the bellows 710 is sealingly coupled to the seal plate 708 typically by brazing. A second end 720 of the bellows 710 is sealingly coupled to the mounting plate 712 in a similar manner.

A port 722 is disposed in the arm 702 to couple a pressure management system 724 to the plenum through a hole 726 formed through the seal plate 708. An o-ring 728 is generally provided circumscribing the hole 726 between the seal plate 708 and the arm 704 to prevent gas leakage therebetween.

The pressure management system 724 generally controls the pressure of the gas (or other fluid) occupying the plenum 716. The pressure management system 724 pressurizes the plenum 716 while the stamp 108 is in contact with the substrate to provide a uniform contact force across the surface of the stamp 108. The pressure management system 724 may also draw a vacuum in the plenum 716 to assist in supporting the stamp 108 while suspended below the arm 704 and not in contact with a substrate. Depending on the flexibility of the mounting plate 712, the pressure management system 724 may control the vacuum provided in the plenum 716 to maintain a predetermined profile (i.e., amount of bow) of the mounting plate 712 and stamp 108.

For example, the center portion of the stamp 108 may be allowed to sag slightly to contact the substrate first relative the surrounding portions of the stamp 108 to ensure the air is allowed to escape as the stamp 108 is contacted with the substrate. If air is trapped between the stamp 108 and the substrate, the precursor may not be transferred between the stamp 108 and substrate at all areas. In another example, a vacuum may be provided to the plenum 716 to prevent the stamp 108 from sagging in its center, thereby supporting the stamp 108 in a flat orientation.

A sensor 730 is mounted in the arm 702 and has an end 732 that is in communication with the plenum 716. An o-ring 734 is disposed between the seal plate 708 and arm 704 to prevent leakage from the plenum 716 around the sensor 730. The sensor 730 provides a metric indicative of the pressure within the plenum 716 to a controller 738. The controller 738 is coupled to the pressure management system 724 to allow real-time control of the plenum pressure and, consequently, the profile of the stamp 108.

The mounting plate 712 is typically fabricated from a rigid material, for example, stainless steel or aluminum, among others. The mounting plate 712 may be typically flexible to allow the profile of the stamp 108 to be controlled. Alternatively, the mounting plate 712 may be configured to maintain a predetermined flatness, thereby maintaining the stamp 108 coupled thereto in a planar orientation.

The stamp 108 is typically coupled to the mounting plate 712 in a removable manner similar to those described above. A backing plate 736, similar to the backing plate 270, may be disposed between the stamp 108 and the mounting plate 706. Alternatively, the backing plate 736 may be fabricated from an elastomeric material, for example foamed polyurethane.

Figure 8:
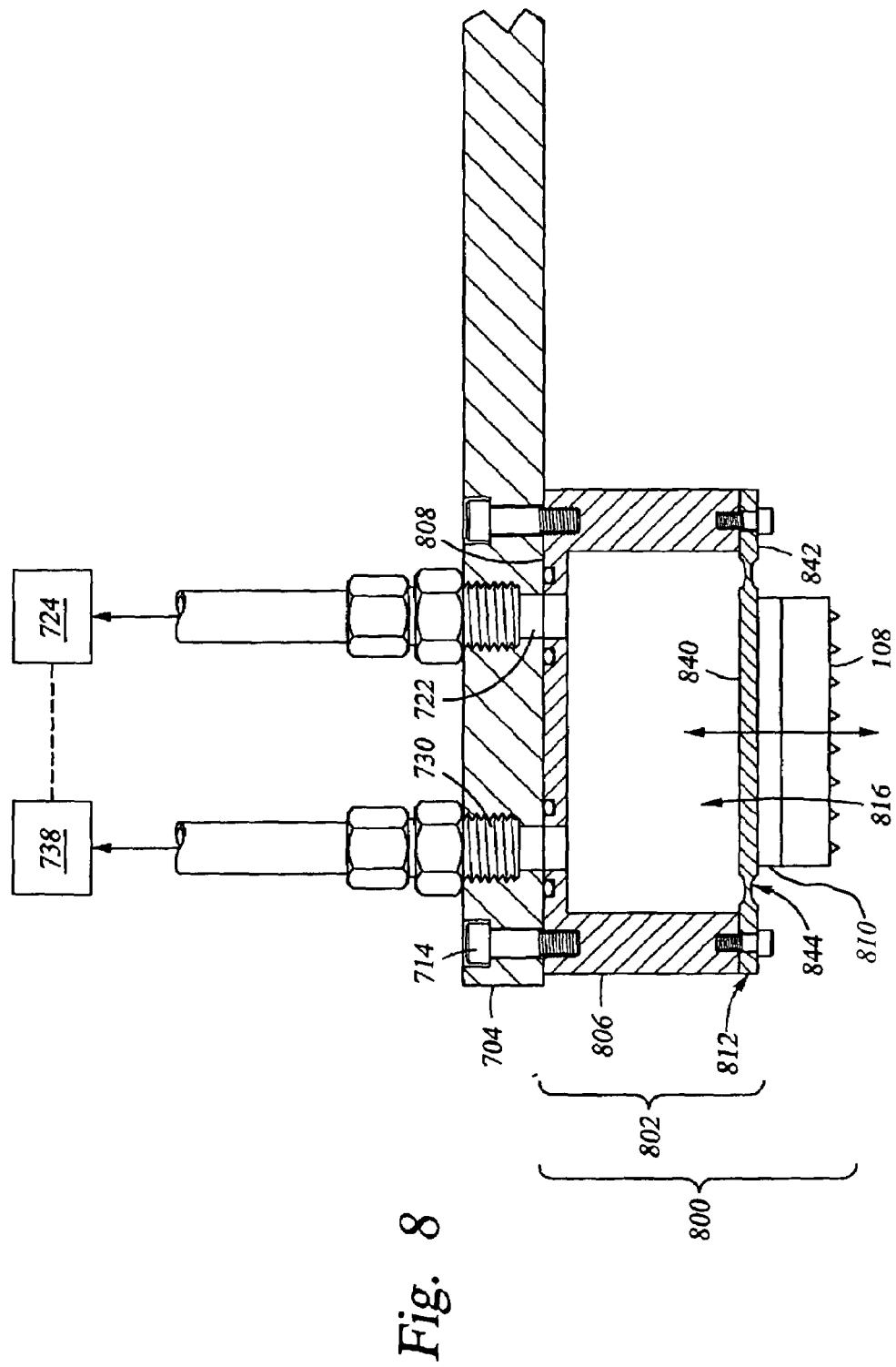
FIG. 8 is a partial sectional view of another embodiment of a stamping head assembly.

FIG. 8 depicts another embodiment of a stamping head assembly 800. The stamping head assembly 800 generally includes a support assembly 802 that couples the stamp 108 to an arm 704 of a head robot (not shown). The support assembly 802 includes a mounting ring 806, a seal plate 808 and a flex plate 812. The mounting ring 806 is typically coupled to the arm 704 by a plurality of fasteners 714. The mounting ring 806 is fabricated from a rigid material such as aluminum or stainless steel, among others.

The seal plate 808 is coupled to the mounting ring 806. Alternatively, the seal plate 808 may be fabricated as a unitary portion of the mounting ring 806. The seal plate 808 and mounting ring 806 are sealingly coupled, for example, by adhesives, brazing, welding or by fastening the plate 808 and ring 806 with a seal or o-ring therebetween.

The flex plate 812 is coupled to the mounting ring 806. The flex plate 812, the seal plate 808 and the mounting ring 806 define an expandable plenum 816 therebetween. The flex plate 812 provides a mounting surface for the stamp 108. The flex plate 812 is configured to provide axial motion so that as the plenum 816 is pressurized, uniform force is applied across the width of the stamp 108.

In one embodiment, the flex plate 812 has one-piece construction and is typically fabricated from metal or plastic. The flex plate 812 includes a center pad 840 coupled to a circumscribing mounting pad 842 by a flexure 844. The flexure 844 allows the center pad 840, which has the stamp 108 removably coupled thereto, to move relative to the mounting pad 842. Thus, as the plenum 816 is pressurized (or evacuated), the center pad 840 and the stamp 108 may be urged away (or towards) the arm 704. In one embodiment, the flexure 844 is configured as an annular ring of material thinner than the material thickness of the adjacent center pad 840 and mounting pad 842.

A pressure management system 724 is coupled through a port 722 disposed in the arm 702 to the plenum 816 and controls the pressure in the plenum 816. A sensor 730 is mounted in the arm 702 and is in communication with the plenum 816. The sensor 730 provides a metric indicative of the pressure within the plenum 816 to a controller 738. The controller 738 is coupled to the pressure management system 724 to allow real-time control of the pressure in the plenum and, consequently, the profile of the stamp 108.

The stamp 108 is typically coupled to the center pad 840 in a removable manner, similar to those described above. A backing plate 810, similar to the backing plate 270, may be disposed between the stamp 108 and the flex plate 812. Alternatively, the backing plate 810 may be fabricated from an elastomeric material, for example foamed polyurethane.

FIG. 9 depicts another embodiment of a head prep station 900. The head prep station 900 includes an inking station 940 and a staging station 942 and a turntable 944. The inking station 940 is similar to the head prep station 104 described above while the staging station 942 queues one or more replacement stamping head assemblies 906. The staging station 942 includes a transfer platform 912, a feed rail 914 and a waste rail 916. The feed rail 914 queues one or more replacement stamping head assemblies 906. The head assemblies 906 may include a new stamp having the same patterned disposed on the bottom surface of the stamp to replace a worn stamp of the head assembly 908 or a new stamp having a new pattern disposed on the bottom surface of the stamp for producing a different metallization pattern on the substrate.

The transfer platform 912 of the staging station 942 and the inking station 940 are coupled to the turntable 944. The turntable 944 generally allows one of replacement head assemblies 906, typically comprising a stamp 108 and backing plate 270, to be transferred from the feed rail 914 to a head robot 920. Additionally, a used stamping head assembly 908 is simultaneously transferred by the turntable 944 after being released by the robot 920 to the staging station 942 for removal from the system. Typically, the replacement stamp 906 is transferred to the head robot 920 in the inking station 940 to minimize the time required to exchange and ink the stamp assemblies 906, 908.

The turntable 944 typically includes an actuator 946 that controls the elevation of the inking and staging stations 940, 942. Thus, as the head robot 920 receives the replacement stamping head assembly 906 from the inking station 940, the actuator 946 is activated to elevate the inking station 940 to an elevation that engages the locating pins 282 of the head assembly 906 with the associated locating or attachment mechanisms of the head robot 920 (such as depicted with reference to the head robot 140 in FIG. 2). Likewise, the turntable 944 may be lowered to clear the stamp assemblies 906, 908 from the head robot 920 to facilitate rotation of the turntable 944. The actuator 946 may also be utilized to bring the inking station 940 into contact with the stamp 108 to transfer the precursor to the bottom surface 112 of the stamp 108.

The staging station 942 may hold one or more replacement head assemblies 906 that produce the same or different patterns. In one embodiment, the staging station 942 may be positioned by the turntable 944 to dispose the platform 912 in a first position adjacent both the feed rail 914 and the waste rail 916. The platform 912 may be positioned by the turntable 944 in a second position that aligns the platform 912 in a predetermined position that facilitates transfer of head assemblies with the head robot 920.

The feed rail 914 is adapted to provide a supply of queued head assemblies 906 to the platform 912. The feed rail 914 may move the head assemblies 906 by gravity, air jet, pallet, belt or other method. An escapement mechanism 918, such as a pneumatically controlled gate, is disposed between the feed rail 914 and platform 912 to selectively control the loading of a single queued head assembly 906 to the platform 912. Alternatively, a small transfer mechanism (not shown) may be employed to move the head assembly between the feed rail 914 and the platform 912.

The waste rail 916 is disposed proximate the platform 912 when in the second position to facilitate the removal of the used head assembly 908 from the platform 912. The waste rail 916 typically is a gravity slide or chute that directs the used head assembly into a disposal or recycling bin 948.

The platform 912 typically is configured with an actuator 922 that rotates a plate 924 coupled to the platform 912 by a hinge 926. The actuator 922 may be energized to flip the used head assembly 908 onto the waste rail 916 where it is transferred to the recycling bin 948.

Figure 10:
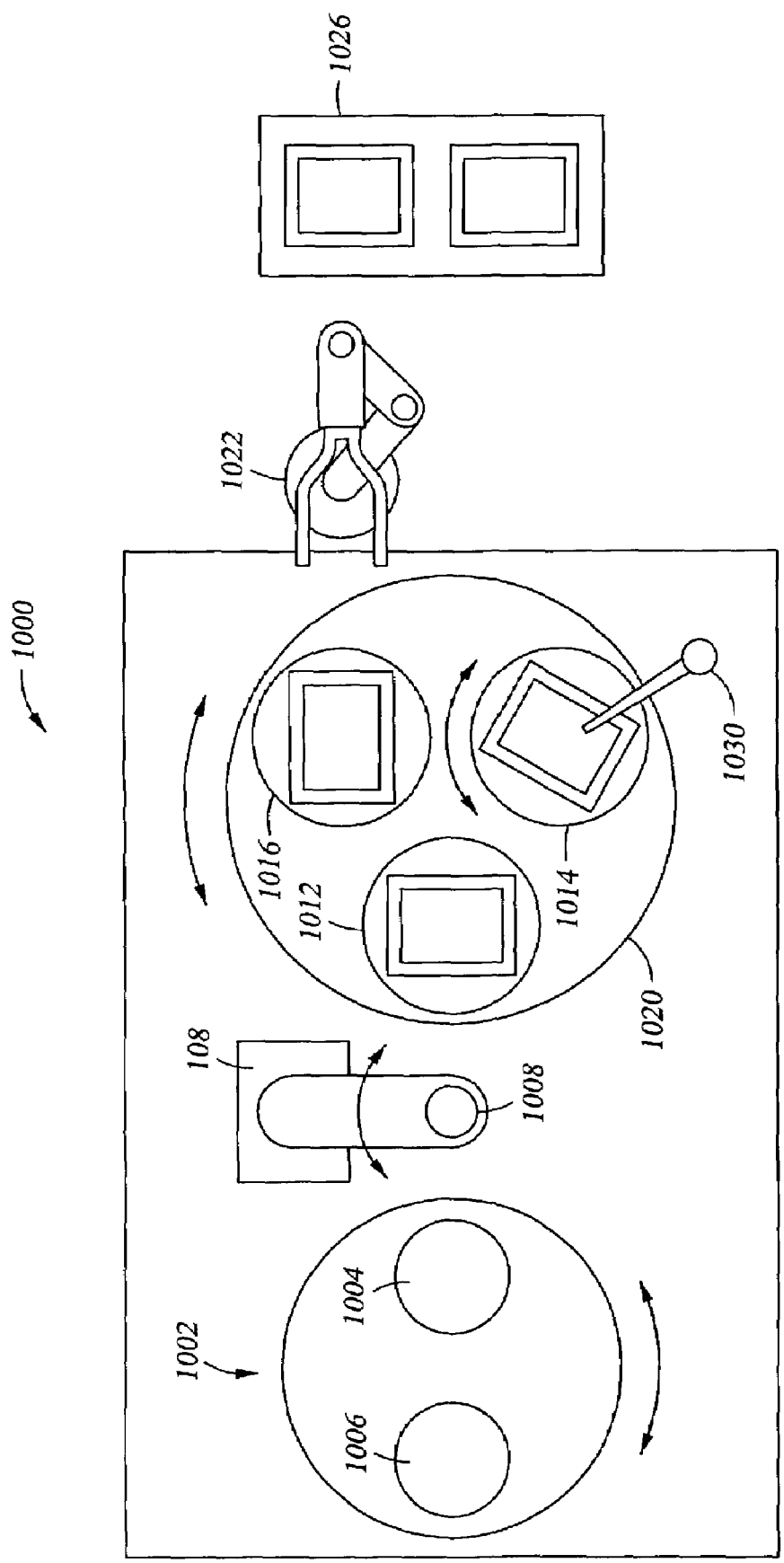
FIG. 10 is a top plan view of another embodiment of a processing system adapted for direct deposition of patterned metal on large area substrates.

FIG. 10 depicts a top plan view of another embodiment of a processing system 1000 adapted for direct deposition of patterned metal on large area substrates. The system 1000 including a head prep station 1002 having an inking station 1004 and a staging station 1006, a head robot 1008 and a plurality of stamping stations mounted to a turntable 1020. The head prep station 1002 and head robot 1008 are similar to those described above. A transfer robot 1022 is disposed proximate the turntable 1020 and configured to move substrates between the stamping stations disposed on the turntable 1020 and a factory interface 1026 that stores a plurality of substrates.

The stamping stations, shown as three stamping stations 1012, 1014, 1016 in the embodiment depicted in FIG. 10, are configured similar to the stamping station 106 described above and are adapted to retain a substrate during stamping and electroless deposition processes. The turntable 1020 selectively positions each station 1012, 1014, 1016 proximate the head robot 1008 and the transfer robot 1022 to facilitate stamping and removal of the substrates from the turntable 1020. The stamping station 1014, shown in an indexed position between the stations 1012 and 1016 positioned adjacent the robots 1008 and 1022, is disposed proximate an electrolyte delivery system 1030 similar to the system 160 described above to facilitate electroless deposition on the substrate after stamping and prior to removal from turntable 1020.

Figure 11:
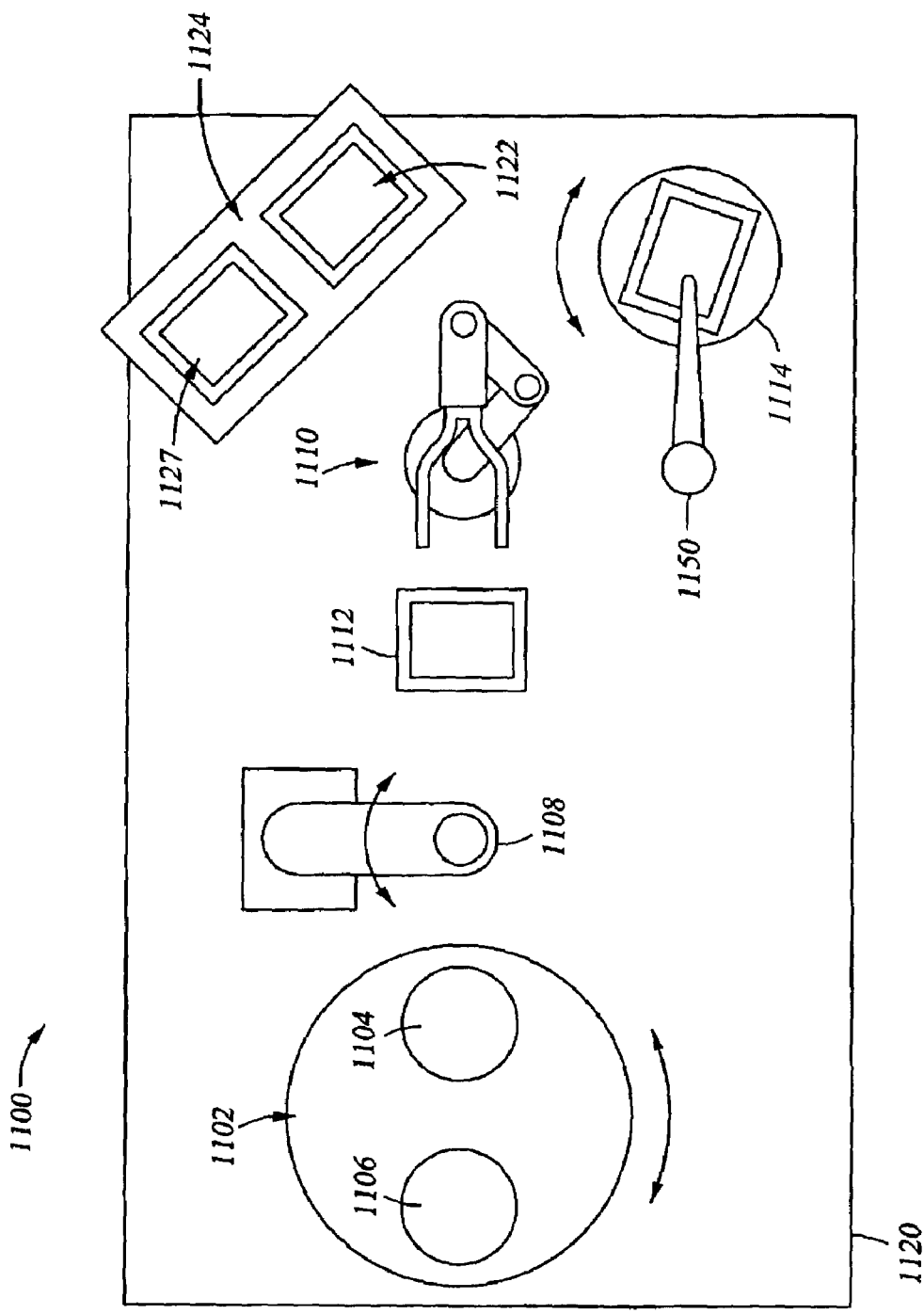
FIG. 11 is a top plan view of another embodiment of a processing system adapted for direct deposition of patterned metal on large area substrates.

FIG. 11 depicts a top plan view of another embodiment of a system 1100. The system 1100 includes a head prep station 1102 having an inking station 1104 and a staging station 1106, a head robot 1108, a transfer robot 1110, a stamping station 1112, a plating station 1114 and a factory interface 1124. The head prep station 1102 and head robot 1108 are similar to those described above. The stamping station 1112 and the plating station 1114 are mounted to a base 1120 of the system 1100.

The transfer robot 1110 is configured to transfer substrates 1122 between the factory interface 1124, the stamping station 1112 and the plating station 1114. Typically, a substrate to be processed by the system 1100 is transferred by the transfer robot 1110 from the factory interface 1124 to the stamping station 1112, which is configured similar to those described above. After transferring a precursor to the substrate disposed in the stamping station 1112, the transfer robot 1110 transfers the substrate from the stamping station 1112 to the plating station 1114.

The plating station 1114 is generally configured similar to the stamping station 106 described above to facilitate electroless deposition on the substrate. The plating station 1114 includes an electrolyte delivery system 1150 adapted to deliver electrolyte to a substrate positioned in the plating station 1114. One example of a plating station that may be adapted to benefit from the invention is described in U.S. patent application Ser. No. 10/143,212, filed May 9, 2002, which is hereby incorporated by reference in its entirety.

After plating, the substrate is retrieved from the plating station 1114 by the transfer robot 1110 and returned to the factory interface 1124.

Thus, a processing system for processing large area substrates has been disclosed. The inventive system features direct metallization of large area substrates utilizing microcontact printing of a precursor on the substrate followed by a plating step. Advantageously, the processing system facilitates conductive line formation on large area substrates with minimal steps on a compact system while avoiding the use of costly vacuum processing environments.

While the foregoing is directed to the preferred embodiment of the present invention, other and further embodiments of the invention may be devised without departing from the basic scope thereof. The scope of the invention is determined by the claims that follow.

What is claimed is:

1. A system for processing large area substrates, comprising:
    a stamp having a patterned surface adapted for microcontact printing;
    a prep station for applying a precursor to the patterned surface, wherein the prep station comprises a basin positioned for providing the precursor to the patterned surface of the stamp;
    a stamping station comprising a large area substrate support; and
    a robot adapted to move the stamp between the stamping station and the prep station.

2. The system of claim 1, wherein the prep station further comprises:
    a precursor retaining pad disposed within the basin and adapted to wet the patterned surface of the stamp.

3. The system of claim 2, wherein the pad is fabricated from a porous, meshed or non-woven material.

4. The system of claim 2 further comprising:
    an actuator coupled to one of the basin and the stamp, the actuator adapted to place the pad disposed in the basin in contact with the patterned surface of the stamp.

5. The system of claim 1 further comprising;
    a precursor replenishment system having an outlet positioned to flow a predetermined quantity of precursor to the basin.

6. The system of claim 1, wherein the stamping station further comprises:
    a platen having a flat support surface adapted to support the large area substrate thereon.

7. The system of claim 6, wherein the platen is fabricated from granite, stainless steel, quartz or ceramic.

8. The system of claim 6, wherein the platen has at least one hole or channel formed therein adapted to distribute a vacuum between the plenum and the substrate.

9. The system of claim 6 further comprising:
    a chucking system adapted to provide a vacuum or pressurized fluid between the platen and the substrate seated thereon.

10. The system of claim 1, wherein the robot has the stamp coupled thereto.

11. The system of claim 1, wherein the stamping station is not enclosed by a vacuum chamber.

12. The system of claim 1, further comprising:
    a backing coupled to a side of the stamp opposite the patterned surface, the backing having a stiffness greater than that of the stamp.

13. The system of claim 12, wherein the backing further comprises:

a plurality of micro-machined barbs extending therefrom and engaging the stamp.

14. A system for processing large area substrates, comprising:
- a stamp having a patterned surface adapted for microcontact printing;
- a prep station for applying a precursor to the patterned surface, wherein the prep station comprises a temperature control system adapted to maintain the precursor disposed in the prep station at a predetermined temperature;
- a stamping station comprising a large area substrate support; and
- a robot adapted to move the stamp between the stamping station and the prep station.

15. The system of claim 14, wherein the temperature control system comprises:
- a sensor coupled to a basin; and
- a means for controlling the temperature of the precursor in the basin.

16. The system of claim 15, wherein the means for controlling the temperature of the precursor disposed in the basin further comprises:
- a temperature control plate coupled to the basin.

17. The system of claim 16, wherein the temperature control plate further comprises:
- at least one temperature control mechanism disposed in or coupled to the temperature control plate and selected from the group consisting of a resistive heater, a conduit for flowing a heat transfer fluid, a radiant heater or a thermal electric device.

18. A system for processing large area substrates, comprising:
- a stamp having a patterned surface adapted for microcontact printing;
- a prep station for applying precursor to the patterned surface;
- a stamping station comprising a large area substrate support, wherein the stamping station comprises an electrolyte delivery system adapted to selectively provide an electrolyte to the large area substrate and a source of the electrolyte coupled to the electrolyte delivery system; and
- a robot adapted to move the stamp between the stamping station and the prep station.

19. The system of claim 18 further comprising:
- a rotary actuator coupled to the stamping station and adapted to rotate the substrate.

20. The system of claim 18, wherein the prep station further comprises:
- a basin positioned for providing a precursor to the patterned surface of the stamp.

21. The system of claim 20, wherein the prep station further comprises:
- a precursor retaining pad disposed within the basin and adapted to wet the patterned surface of the stamp.

22. The system of claim 21, wherein the pad is fabricated from a porous, meshed or non-woven material.

23. The system of claim 20, further comprising:
- a precursor replenishment system having an outlet positioned to flow a predetermined quantity of precursor to the basin.

24. The system of claim 21, further comprising:
- an actuator coupled to one of the basin and the stamp, the actuator adapted to place the pad disposed in the basin in contact with the patterned surface of the stamp.

25. A system for processing large area substrates, comprising:
- a stamp having a patterned surface adapted for microcontact printing;
- a prep station for applying a precursor to the patterned surface;
- a stamping station comprising a large area substrate support;
- a robot adapted to move the stamp between the stamping station and the prep station; and
- a backing coupled to a side of the stamp opposite the patterned surface, the backing having a stiffness greater than that of the stamp, wherein the backing further comprises a plurality of micro-machined barbs extending therefrom and engaging the stamp.

26. A system for processing large area substrates, comprising:
- a stamp having a patterned surface adapted for microcontact printing;
- a prep station for applying a precursor to the patterned surface;
- a stamping station comprising a large area substrate support;
- a head assembly selectively supported over the prep station and the stamping station and adapted for having the stamp coupled thereto; and
- a robot adapted to move the stamp between the stamping station and the prep station.

27. The system of claim 26, wherein the head assembly further comprises:
- a head assembly actuator coupled thereto and adapted to selectively place the patterned surface of the stamp in contact with at least one of the prep station or the substrate supported in the stamping station.

28. The system of claim 26, wherein the head assembly further comprises:
- a seal plate; and
- a bellows coupled between the seal plate and the stamp.

29. The system of claim 28 further comprising:
- a pressure management system coupled to a plenum defined between the seal plate and stamp, the pressure management system adapted to control the distance between the seal plate and stamp.

30. The system of claim 26, wherein the head assembly further comprises:
- a seal plate;
- a center pad coupled to the stamp; and
- a flexure coupling the seal plate to the center pad.

31. The system of claim 30 further comprising:
- a pressure management system coupled to a plenum defined between the seal plate and center pad, the pressure management system adapted to control a spacing between the seal plate and center pad.

32. The system of claim 26, wherein the head assembly includes a quick release device adapted to facilitate removal of the stamp.

33. The system of claim 32, wherein the quick release device is selected from the group consisting of a collet, a vacuum chuck, a snap fit, an electrostatic chuck, adhesives, fasteners, a magnetic chuck, clamp and latches.

34. The system of claim 26, wherein
the robot is coupled to the head assembly and adapted to selectively position the patterned surface of the stamp over the prep station and the stamping station.

35. A system for processing large area substrates, comprising:

a stamp having a patterned surface adapted for microcontact printing;

a prep station for applying a precursor to the patterned surface;

a staging station disposed proximate the prep station and adapted to hold at least one replacement stamp;

a stamping station comprising a large area substrate support; and a robot adapted to move the stamp between the stamping station and the prep station.

36. The system of claim 35, wherein the replacement stamp has a patterned bottom surface identical to the stamp.

37. The system of claim 35, wherein the replacement stamp has a second patterned bottom surface that is different than the patterned bottom surface of the stamp.

38. The system of claim 35 further comprising:
a turntable having the prep station and at least a portion of the staging station coupled thereto.

39. A system for processing large area substrates, comprising:
a stamp having a patterned surface adapted for microcontact printing;

a prep station for applying a precursor to the patterned surface;

a stamping station comprising a large area substrate support;

a plating station disposed proximate the stamping station; and a robot adapted to move the stamp between the stamping station and the prep station.

40. A system for processing large area substrates, comprising:
a stamp having a patterned surface adapted for microcontact printing;

a prep station for applying a precursor to the patterned surface;

a stamping station comprising a large area substrate support, wherein the stamping station further comprises a plurality of platens adapted to support a respective substrate thereon and a turntable having the platens coupled thereto; and a robot adapted to move the stamp between the stamping station and the prep station.

41. The system of claim 40 further comprising:
an electrolyte delivery system disposed proximate the turntable and adapted to dispose an electrolyte on one of the platens indexed proximate thereto.

42. A system for processing large area substrates, comprising:
a stamp having a patterned bottom surface adapted for microcontact printing;

a prep station, comprising a basin for holding a precursor and adapted to interface with the stamp;

a stamping station, comprising a first platen adapted to support the large area substrate thereon;

a vacuum source coupled to the platen and adapted to vacuum chuck the large area substrate to the platen;

a device adapted to selectively place the stamp in contact with the stamping station and the prep station; and an electrolyte delivery system adapted to selectively provide an electrolyte to the large area substrate.

43. The system of claim 42, wherein the electrolyte delivery system is disposed proximate the first platen.

44. The system of claim 42 further comprising:
at least a second platen; and
a first turntable having the platens coupled thereto, the first turnable adapted to selectively position one of the platens proximate the electrolyte delivery system.

45. The system of claim 44 further comprising:
a second turntable having the basin coupled thereto; and
a platform coupled to the turntable adapted to retain the stamp thereon.

46. The system of claim 45 further comprising:
at least one replacement stamp disposed proximate the turntable; and
a mechanism for transferring the replacement stamp to the platform disposed on the turntable.

47. The system of claim 42, wherein the stamping station is not enclosed by a vacuum chamber.

* * * * *